United States Patent [19]
Buch

[11] Patent Number: 5,712,636
[45] Date of Patent: Jan. 27, 1998

[54] PULSE-WIDTH-MODULATED DIGITAL-TO-ANALOG CONVERTER WITH HIGH GAIN AND LOW GAIN MODES

[75] Inventor: Bruce D. Buch, Westboro, Mass.

[73] Assignee: Quantum Corp., Milpitas, Calif.

[21] Appl. No.: 677,147

[22] Filed: Jul. 9, 1996

[51] Int. Cl.⁶ .................................................. H03M 1/82
[52] U.S. Cl. .................... 341/152; 341/145; 375/238
[58] Field of Search ........................ 341/131, 139, 341/141, 145, 152, 53; 332/109; 370/205, 212; 375/238

[56] References Cited

U.S. PATENT DOCUMENTS

| | | | |
|---|---|---|---|
| 4,595,910 | 6/1986 | Wine | 340/347 DA |
| 4,742,329 | 5/1988 | Yamada et al. | 340/347 AD |
| 4,931,751 | 6/1990 | Keller et al. | 332/108 |
| 5,021,788 | 6/1991 | Ueki et al. | 341/152 |
| 5,148,168 | 9/1992 | Masuda et al. | 341/152 |
| 5,255,136 | 10/1993 | Machado et al. | 360/77.02 |

OTHER PUBLICATIONS

AN538, "Using PWM to Generate Analog Output in PIC17C42", *Embedded Control Handbook*, ©1992, Microchip Technology, Inc., pp. 3–13 to 3–14.

AN539, "Frequency and Resolution Options for PWM Outputs in the PIC17C42", *Embedded Control Handbook*, ©1992, Microchip Technology, Inc., pp. 3–3 to 3–12.

*Primary Examiner*—Fritz Fleming
*Assistant Examiner*—Jason L. W. Kost
*Attorney, Agent, or Firm*—David B. Harrison

[57] ABSTRACT

A pulse-width-modulated digital-to-analog converter is responsive to a digital control value for switching between a high gain mode and a low gain mode. The converter includes a free-running rollover counter, a reference register and a comparator. Pulses from a comparator are split into two paths, one path including a switch, and fed into a plurality of resistive elements connected connected to a common output node. Depending on the state of the switch, the network's output value will either follow its input or be a fraction thereof, without change of duty cycle or output impedance. The output node may be connected to a capacitive element to form a low pass filter for generating an analog waveform.

15 Claims, 3 Drawing Sheets

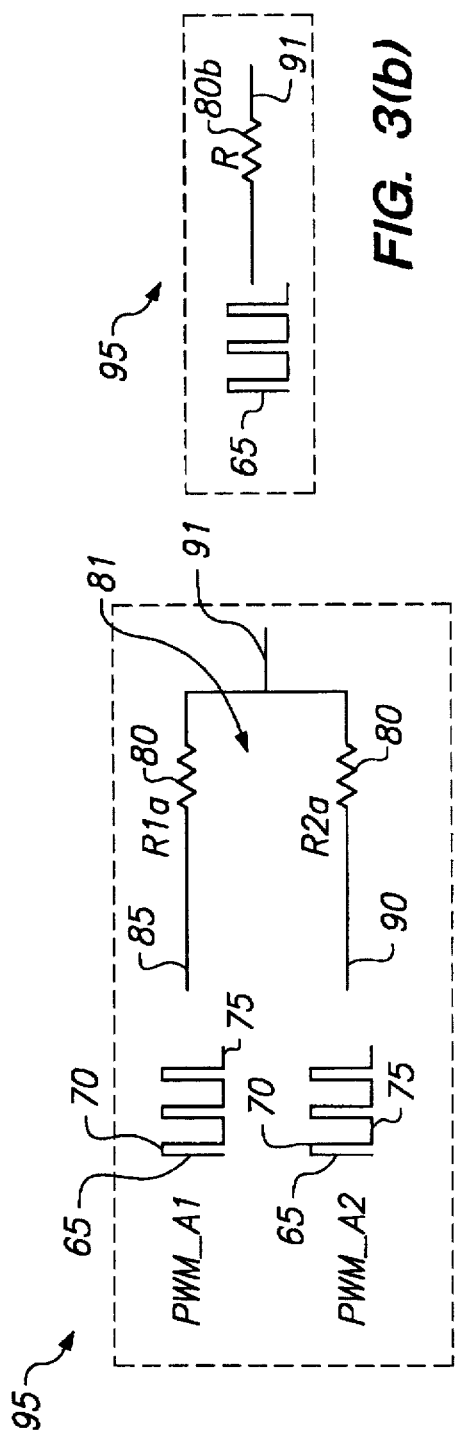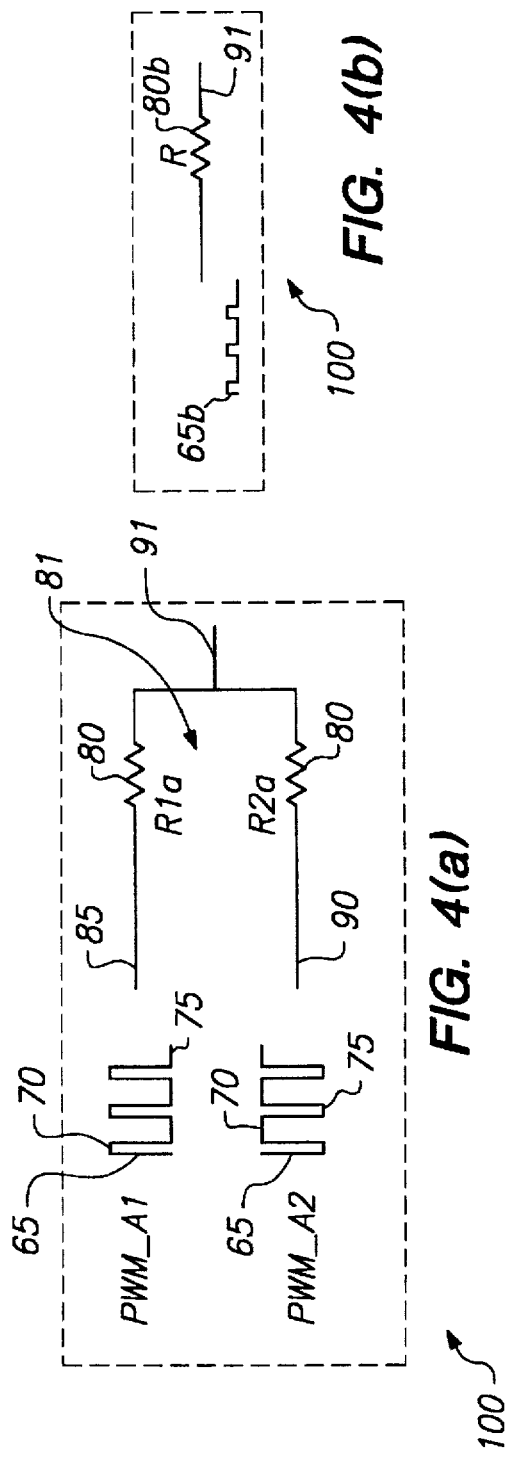

PULSE-WIDTH-MODULATED DIGITAL-TO-ANALOG CONVERTER WITH HIGH GAIN AND LOW GAIN MODES

CROSS-REFERENCE TO RELATED PATENT

This invention is related to the disclosure of the present inventor's commonly assigned U.S. patent application Ser. No. 08/642,754, filed on May 3, 1996 and entitled: "Rotated-Bit Pulse Width Modulated Digital-To-Analog Converter", the disclosure being incorporated herein by reference thereto.

FIELD OF THE INVENTION

The invention relates generally to a pulse-width-modulated digital-to-analog (PWM D/A) converter having a switching feature for switching between a high gain mode and a low gain mode while maintaining a constant output impedance.

BACKGROUND OF THE INVENTION

The function of a PWM D/A is to convert digital values into an analog waveform. A typical PWM D/A converter, which is responsive to a digital control value, comprises a cyclic counter for counting, based on a reference clocking signal, to (or from) a predetermined value before resetting. Each incremental count cycle of the counter is compared to the digital control value by a comparator. The comparator generates a two-level digital output signal, which is asserted when the counter value exceeds (or is below) the digital control value. Generally, the duty cycle of the comparator output may be controlled by adjusting the digital control value, which is held in a register. The two-level digital output signal may be subsequently low pass filtered and results in an analog waveform having an amplitude that is a function of the duty cycle of the comparator.

One conventional method of achieving a pulse-width-modulated, digital-to-analog signal conversion having an output with both a high gain mode and a low gain mode is to increase the resolution of the of the PWM D/A by increasing the bit width of the counter and the comparator during a high gain mode. While during a low gain mode, the output of the PWM D/A may be realized by operating over a proportional range of the increased bit width. However, the increased resolution of the PWM D/A substantially increases the complexity of the digital circuitry required. Moreover, the increased resolution decreases the frequency of the two-level digital output signal generated by the comparator, thus increasing the response time of the PWM D/A converter.

A second conventional method of achieving a pulse-width-modulated, digital-to-analog signal conversion having an output with both a high gain mode and a low gain mode is to implement two independent PWM D/A channels, wherein the two channels may summed together at the input to the low pass filter. The summing components of the two independent channels are such that one channel implements a high gain mode component, and the other channel implements a low gain mode component. During low gain mode, the high gain mode channel is put into a high impedance state, thus removing the high gain mode component from being summed. Although the high gain mode channel is disabled during low gain mode operation, very small leakage currents emitted from the high gain mode channel may nevertheless introduce errors into the sum. Furthermore, it is difficult to maintain a constant output impedance, as realized by the low pass filter, by employing the two independent channels as described.

Thus, a hitherto unsolved need has remained for a method of achieving a pulse-width-modulated, digital-to-analog signal conversion having an output with both a high gain mode and a low gain mode and with substantially constant output impedance.

SUMMARY OF THE INVENTION

One general object of the present invention is to provide a pulse-width-modulated digital-to-analog converter which provides multiple gain modes without change in output impedance in a manner overcoming limitations and drawbacks of the prior art.

In accordance with principles of the invention, a pulse-width-modulated digital-to-analog converter is responsive to a digital control value for switching between a high gain mode and a low gain mode. The converter includes a free-running rollover counter, a reference register and a comparator. Pulses from a comparator are split into two paths, with each path driving an input of a conventional two-level voltage-output driver. One path includes e.g. an exclusive-OR (XOR) gate between the comparator output and the driver input for conditionally inverting the comparator output signal level for that path. Both paths are fed into a plurality of resistive elements connected connected together at a common output node. Depending on the state of the switch, the network's output value will follow its input or be a fraction thereof, without change of duty cycle or output impedance. The output node may be connected to a capacitive element to form a low pass filter for generating an analog waveform.

One advantage of the present invention is realized when the pulse-width-modulated, digital-to-analog converter is in its low gain mode, where a minimal peak to peak voltage may be delivered to a low pass RC filter formed at the output node, thereby minimizing high frequency ripple at the output of the converter.

Another advantage of the present invention is realized by providing a gain switch functionality for a pulse-width-modulated, digital-to-analog circuit configuration which requires a minimum of additional switching hardware elements, since in preferred form the switch may comprise a single XOR gate element.

The resistive network, in either high gain mode or low gain mode, may be further connected to one or more capacitive elements to form a low pass filter at the output node for generating an analog waveform having an amplitude proportional to the input voltage. Moreover, in either modes, the output impedance of the filter remains substantially constant. Therefore, the filter's time constant will also remains constant, where the time constant, τ, is defined as τ=RC, with R defining the filter's equivalent resistance and C defining the filter's equivalent capacitance.

BRIEF DESCRIPTION OF THE DRAWINGS

In the drawings:

FIG. 3(a) is a partial illustration of the FIG. 1 schematic in high gain mode.

FIG. 3(b) is an equivalent source driving an equivalent resistance of the FIG. 3(a) schematic in high gain mode.

FIG. 4(a) is a partial illustration of the FIG. 1 schematic in low gain mode.

FIG. 4(b) is an equivalent source driving an equivalent resistance of the FIG. 4(a) schematic in low gain mode.

DETAILED DESCRIPTION OF A PREFERRED EMBODIMENT

Figures 1, 2:
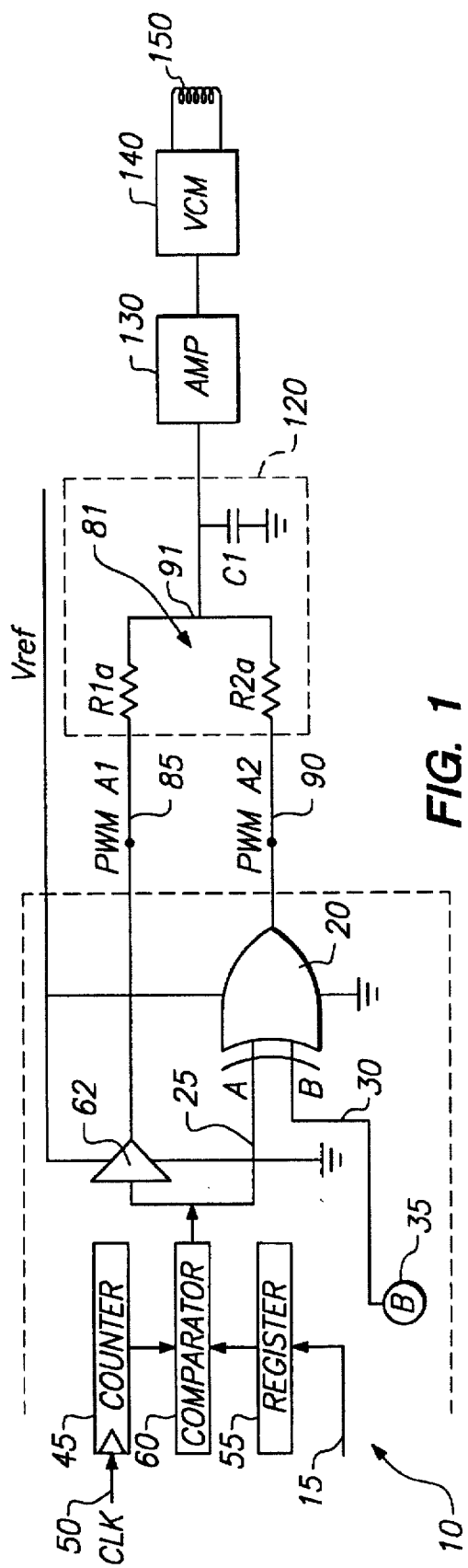
FIG. 1 is a schematic of the PWM D/A converter with a switching function for switching between a high gain mode and a low gain mode.
FIG. 2 is an truth table for the FIG. 1 schematic.

FIG. 1 illustrates a preferred embodiment of a PWM D/A converter 10 incorporating principles of the present invention. The PWM D/A converter 10 is responsive to a digital control value 15 held in a register 55. The converter 10 includes a switching circuit 20 which enables switching between a high gain mode and a low gain mode in accordance with a logical value B on a path 30. In this example the switching circuit 20 comprises an XOR gate that receives a first input signal A from a path 25 leading from a comparator 60 and the second input B on the path 30 which extends from an independent control signal source 35, such as a system microprocessor or other control logic. Furthermore, the states of the switch 20 are consistent with the truth table 40 as shown in FIG. 2.

The FIG. 1 PWM D/A converter 10 further comprises a cyclic counter 45 responsive to a clocking signal 50 for counting to a predetermined value before resetting. (While an up-counter is presently preferred for the counter 45, a down-counter may also be used as a suitable cyclic counter). The digital control value on the path 15 may be generated by a system microprocessor (not shown), and is stored in a register 55.

During each operational cycle, a comparator 60 compares the digital control value held in the register 55 with the count value of the cyclic counter 45 and generates a two level digital output signal 65. More precisely in the FIG. 1 example, if the count value of the counter 45 exceeds the digital control value 15, the comparator 60 generates e.g. a logical true or "high" level 70, graphed in FIGS. 3A and 4A. Conversely, if the count value of the counter 45 does not exceed the digital control value 15, the comparator 60 generates e.g. a logical false or "low" level 75. Therefore, the digital control value 15 essentially defines a duty cycle of the comparator 60 output.

The output from the comparator 60 provides the logical condition A over path 25 to one input of the XOR switch 20 and also to a voltage driver 62. The driver 62 selectively switches an output between a voltage supply bus Vref and ground in accordance with the incoming logical condition on path 25. In the present example the voltage switching characteristics of the voltage driver 62 are selected to be the same as output driver characteristics of the exclusive-OR gate 20.

A plurality of resistive elements R1A and R1B are connected to form a parallel output resistance network 81. The network 81 has a first path 85 leading from an output of the active driver 62 through a resistor R1A to a common node 91. The network 81 has a second path 90 leading from an output of the exclusive-OR gate switch 20 through a resistor R2A to the common node 91. And, the common node 91 provides an output path leading to a capacitor C1 to ground and to an amplifier 130. The resistor elements R1A and R2A are given different resistance values (the difference controlling a low gain operating mode); and, the resistances R1A and R2A act in combination with the capacitor C1 to provide a low pass filter function 120 upon the signal appearing on the output path 91.

Operation of the switch 20 is in accordance with the FIG. 2 truth table. The input level B on the path 30 to the XOR switch 20 provides a switch control for switching between high gain mode (B input is low) and low gain mode (B input is high). During high gain mode, the switch output condition PWM A2 on path 90 is the same as the logic condition A on path 25. During low gain mode, the switch output condition PWM A2 on path 90 is a logical complement of the logic condition A on path 25 (and the logic condition PWM A1 on path 85).

The operation of the converter 10 is further illustrated and explained in connection with FIGS. 3a and 3b for high gain mode, and FIGS. 4a and 4b for low gain mode. In the FIGS. 3a and 3b high gain mode, the XOR gate 20 is shown by the FIG. 2 truth table to have output states which follow the logical output levels A of comparator 60 on path 25. Thus, both the path 85 and the path 90 of the of the resistive network 81 are driven in parallel by the two level digital output voltage 65 generated by the comparator 65, one path being through the current source 62, and the other path being through the switch 20. Further, the comparator output level drives the path 85 and the path 90 in unison. With an open-circuit load condition, this results in minimal to no current flow within the resistive network 81, whereby the output level of the network 81 virtually follows the comparator 60 output value, subject to charge/discharge delay of capacitor C1 (if present).

Since two like signals are driving the path 85 and the path 90 of the resistive network 81 during high gain mode, the components thereof may be theoretically reduced to a single logic source 65, which has like characteristics to the comparator values, driving a single resistive element 80b as shown in FIG. 3b. The single resistive element 80b may be calculated as the equivalent resistance of the parallel combination of the resistive elements R1A and R1B of resistive network 81.

As shown in FIGS. 4a and 4b, in the low gain mode the XOR gain switch 20 is in a state such that its output level is complimentary to the output level of comparator 60. Thus, the logic levels delivered to the paths 85 and 90 will have like periods with equal and complimentary amplitudes. Since the path 85 and path 90 of the network 81 are no longer driven with like signals, current will flow through resistors R1A and R2A of the network 81, even in the case of an open-circuit load. Thus, the output level of the network 81 will be proportional to the comparator 60 level based on a voltage division at common node 91 of a series network comprising resistive elements R1A and R2A. The resistance values of resistive elements R1A and R2A are chosen to give a low gain of $(R1A-R2A)/(R1A+R2A)$ wherein the resistance ratio is greater than zero and less than unity, relative to the high gain mode which is at unity.

Referring to FIG. 4b, in contrast to the high gain mode, the low gain mode will have the same network 81 equivalent resistance as the high gain mode, however, the equivalent driving voltage 65b will be referenced to the voltage level supplied by the output drivers. In this regard, it is important to note that the signal impedance of the supply bus Vref is considered the same as the ground return path.

Depending on the comparator output duty cycle, the voltage at node 91 of the resistive network 81 may be segmented into a plurality of voltages with upper and lower boundaries. The upper and lower boundaries are defined by the peak values of the comparator output voltage during high gain mode. However, during the FIG. 4a and 4b low gain mode, the boundaries are defined by the peak values of the voltage at the resistive network output node 91. The number of voltage levels realized within the boundaries is directly proportional to the bit width of the counter 45 and comparator 60. More precisely, the number of voltage levels is equivalent to $2^n$ where n is the bit width of the counter 45 and the comparator 60.

Since the bit width of the counter 45 and the comparator 60 remains constant, the number of voltage levels in either high gain or low gain modes will also remain constant. However, the upper and lower boundaries of the voltage levels will substantially differ between high gain mode and low gain mode. Since the low gain mode boundary voltages as shown in FIG. 4b are defined by the peak values of the voltage divider 65b, the low gain range comprises a narrower voltage range having $2^n$ voltage levels, where n equals the bits width of the counter 45 and comparator 60 values.

While the circuit 10 operates in the FIG. 3a and 3b high gain mode, the boundary voltages are referenced to the voltage level supplied by the output drivers and will thus have a wider dynamic voltage range than the low gain mode, which is a benefit thereof. However, either mode will comprise an equivalent number of voltage levels.

The resistive network 81, in either high gain mode or low gain mode, may be further connected to the capacitive element C1 to form a low pass filter 120 (shown in dashed outline in FIG. 1) for generating an analog waveform having an amplitude proportional to the input voltage. Moreover, in either mode the impedance of the filter 120 remains constant. Therefore, the filter's time constant will also remains constant, where the time constant, $\tau$, is defined as $\tau=RC$, with R defining the filter's equivalent resistance and C defining the filter's equivalent capacitance.

The PWM D/A converter 10 as shown in FIG. 1 may have many different applications because of its ability to switch between the high gain mode and the low gain mode, such that the high gain mode provides a coarse range of voltage amplitude levels and the low gain mode provides a fine range of voltage amplitude levels, wherein the number of levels does not vary from high gain to low gain, and vice versa.

Figure 5:
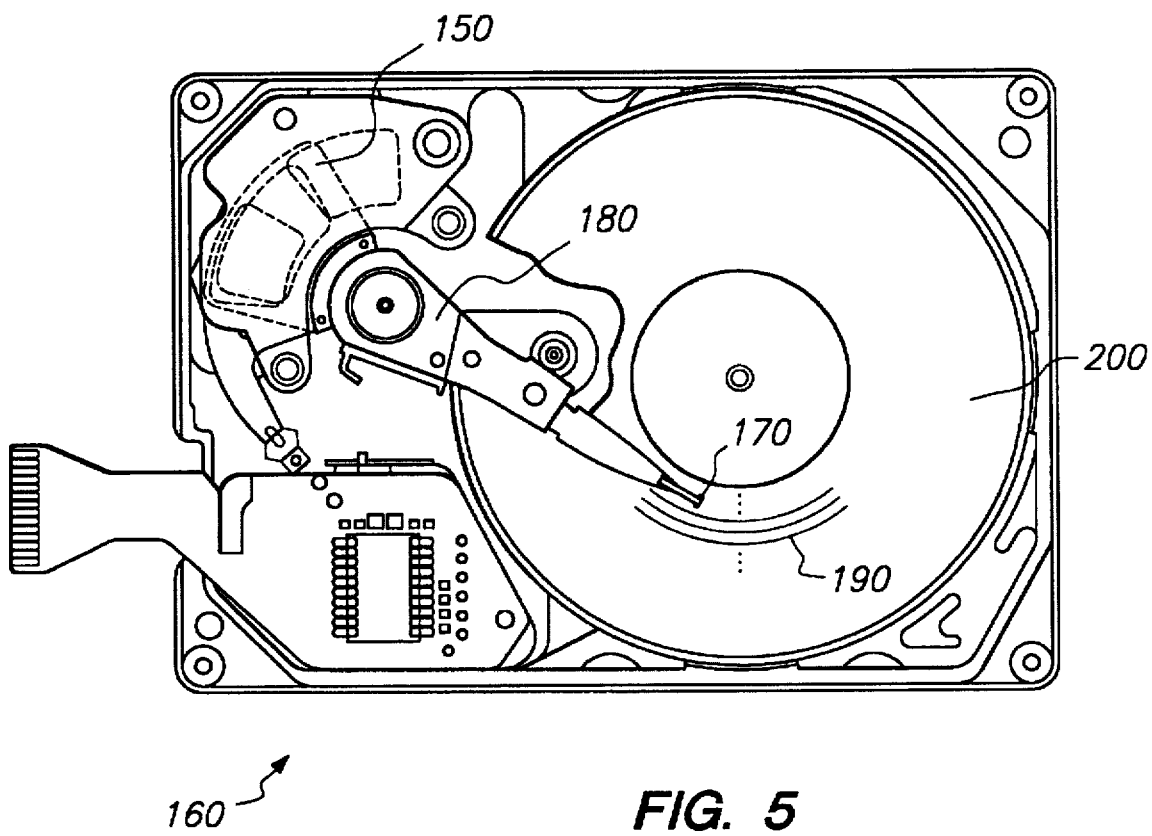
FIG. 5 is a diagrammatic top plan view of a disk drive.

Referring to FIGS. 1 and 5, one preferred application of the present invention is to deliver an analog control waveform from the filter's output to a servo amplifier 130 driving a voice coil actuator motor 140 of a disk drive 160. The voice coil motor 140 is for positioning a transducer 170 carried by an actuator assembly 180 over concentric data tracks 190 of a rotating magnetic disk 200. During actuator seeking operations (accelerating/decelerating), the high gain mode of the circuit 10 is employed to provide an analog coarse positioning signal for rapidly moving the actuator 180 to the vicinity of a target track 190. Once the actuator 180 is within range of a target track 190, the low gain mode is selected in order to put out a fine positioning signal in order to precisely position the transducer 170 at a target data track 190.

Having thus described an embodiment of the invention, it will now be appreciated that the objects of the invention have been fully achieved, and it will be understood by those skilled in the art that many changes in construction and widely differing embodiments and applications of the invention will suggest themselves without departing from the spirit and scope of the invention. The disclosure and the description herein are purely illustrative and are not intended to be in any sense limiting.

What is claimed is:

1. A pulse-width-modulated digital-to-analog converter responsive to a digital control value having a switching means between a high gain mode and a low gain mode in response to a gain mode control signal, comprising:

a roll-over counter responsive to a clocking signal for repetitively counting relative to a predetermined value and resetting;

a comparator connected to compare the digital control value and the counter value and for generating a two-level digital output signal responsive thereto;

a voltage output driver receiving the two-level digital output signal, the switching means controlled by the gain mode control signal and receiving the two-level digital output signal for switching between the high gain mode and the low gain mode, and first and second resistive elements connected to a common output node, the first resistive element connected to an output of the voltage driver, the second resistive element connected to an output of the switching means, the output node providing an output for the pulse width modulated digital-to-analog converter.

2. The pulse-width-modulated digital-to-analog converter set forth in claim 1 wherein the switching means comprises an exclusive-OR gate having a first input receiving the two-level digital output signal and having a second input receiving the gain mode control signal.

3. The pulse-width-modulated digital-to-analog converter set forth in claim 2 wherein the network further comprises at least one capacitive element connected to the output node thereby forming a low pass filter having a constant output impedance in both high gain mode and low gain mode.

4. The pulse-width-modulated digital-to-analog converter set forth in claim 3 wherein the output of the network is segmented into a plurality of voltage levels having upper and lower boundaries, the boundaries being defined by peak output values of output drivers during the high gain mode, and the boundaries being defined by the peak values at the output node of the network during low gain mode.

5. The pulse-width-modulated digital-to-analog converter set forth in claim 4 wherein the number of voltage levels realized between the upper and lower boundaries is defined by the expression, $2^n$, where n equals a bit width of the counter and the comparator.

6. The pulse-width-modulated digital-to-analog converter set forth in claim 6 wherein the high gain mode defines a coarse range of voltage levels at the common output node.

7. The pulse-width-modulated digital-to-analog converter set forth in claim 6 wherein the low gain mode defines a fine range of voltage levels at the common output node.

8. The pulse-width-modulated digital-to-analog converter set forth in claim 3 wherein the filter may be further connected to a voice coil motor of a disk drive via an amplifier for positioning a transducer carrying actuator assembly over concentric data tracks of a rotating magnetic disk.

9. The pulse-width-modulated digital-to-analog converter set forth in claim 1 wherein the first and second resistive elements receive signals having the same amplitude and period during the high gain mode.

10. The pulse-width-modulated digital-to-analog converter set forth in claim 1 wherein the first and second resistive elements (R1A and R2A) receive signals having the same period and complimentary amplitudes during the low gain mode in accordance with a resistance ratio comprising (R1A−R2A)/(R1A+R2A) greater than zero and less than unity, relative to a high gain mode referenced at unity.

11. A dual gain mode pulse-width-modulated digital-to-analog converter having an output node and comprising:

a roll-over counter for repeatedly counting clock pulses received from a clock source relative to a predetermined roll-over value, a register for holding a pulse-width value, a comparator connected to compare counts reached by the roll-over counter with the pulse-width value, and having a comparator output for putting out a two-level logical signal comprising pulse-width-modulation, a voltage output driver for receiving and buffering the comparator output, a switch for receiving and selectively passing the comparator output in accordance with a gain mode switch signal, a resistive network comprising a first resistive element connected to the voltage output driver, a second resistive element connected to the switch, the first and second resistive elements being connected to a common node forming the output node.

12. The dual gain mode pulse-width-modulated digital-to-analog converter set forth in claim 11 further comprising a capacitive element connected in parallel across the output node, thereby forming an output low pass filter with the resistive elements.

13. The dual gain mode pulse-width-modulated digital-to-analog converter set forth in claim 12 further comprising an actuator amplifier and a voice coil actuator, the register holding a pulse-width value for controlling current passing through the voice coil actuator.

14. The dual gain mode pulse-width-modulated digital-to-analog converter set forth in claim 13 wherein the converter, actuator amplifier and voice coil actuator are components of a disk drive, and wherein a controller of the disk drive provides the pulse-width value to the register and provides the mode switch signal to the switch to cause the converter to operate in a high gain mode during a track seeking operation, and to cause the converter to operate in a low gain mode during track settling and following operation, of the disk drive.

15. The dual gain mode pulse-width-modulated digital-to-analog converter set forth in claim 11 wherein the first and second resistive elements (R1A and R2A) establish a low gain output mode in accordance with a low gain resistance ratio (R1A−R2A)/R1A+R2A) is greater than zero and less than unity and wherein a high gain output mode is referenced to unity.

* * * * *